(12) United States Patent
Bhandari et al.

(10) Patent No.: US 6,245,151 B1
(45) Date of Patent: Jun. 12, 2001

(54) LIQUID DELIVERY SYSTEM COMPRISING UPSTREAM PRESSURE CONTROL MEANS

(75) Inventors: Gautam Bhandari, New York, NY (US); Dennis F. Brestovansky, Sandy Hook, CT (US)

(73) Assignee: Advanced Technology Materials, Inc., Danbury, CT (US)

( * ) Notice: Subject to any disclaimer, the term of this patent is extended or adjusted under 35 U.S.C. 154(b) by 0 days.

(21) Appl. No.: 09/463,124
(22) PCT Filed: Jul. 17, 1998
(86) PCT No.: PCT/US98/14650
  § 371 Date: Apr. 6, 2000
  § 102(e) Date: Apr. 6, 2000
(87) PCT Pub. No.: WO99/04061
  PCT Pub. Date: Jan. 28, 1999

(51) Int. Cl.$^7$ ........................................ C23L 16/00
(52) U.S. Cl. ................ 118/726; 392/387; 392/394; 392/399
(58) Field of Search ............... 118/726; 392/387, 392/394, 399

(56) References Cited

U.S. PATENT DOCUMENTS 5,204,314 * 4/1993 Kirlin ........................... 118/726

* cited by examiner

Primary Examiner—Richard Bueker
(74) Attorney, Agent, or Firm—Oliver A. M. Zitzmann; Steven J. Hultquist

(57) ABSTRACT

A liquid delivery system (10) for vaporization of a liquid pecursor to form precursor vapor for transport to a deposition zone (36). The system includes a vaporization chamber (12), a porous vaporization element (60) positioned in the vaporization chamber (12) to define an upstream portion (20) of the vaporization chamber (12) upstream of the porous vaporization element (60), and a downstream portion (22) of the vaporization chamber (12) downstream of the porous vaporization element (60) therein, a vaporization element heater (59), a liquid precursor supply (26) for introducing liquid precursor to the vaporization element (60) for vaporization thereof, a precursor vapor discharge (16) from the chamber, and means (46, 48, 50, 52, 54, 56 and 58) for diverting at least a part of the fluid in the upstream portion of the vaporization chamber (12) past the porous vaporization element (60), to stabilize fluid pressure in the upstream portion of the vaporization chamber (12) under conditions tending to perturb such fluid pressure.

30 Claims, 2 Drawing Sheets

LIQUID DELIVERY SYSTEM COMPRISING UPSTREAM PRESSURE CONTROL MEANS

DESCRIPTION

1. Field Of The Invention

This invention relates generally to an apparatus and method for vaporization of a liquid precursor for transport to a deposition zone, e.g., a chemical vapor deposition (CVD) reactor. More particularly, the present invention relates to a liquid delivery system of such type, in which the pressure upstream of the vaporization means is controllably maintained at a level commensurate with highly efficient operation of the liquid delivery system.

2. Description Of The Related Art

In the formation of thin films, layers and coatings on substrates, a wide variety of source materials have been employed. These source materials include reagents and precursor materials of widely varying types, and in various physical states. To achieve highly uniform thickness layers of a conformal character on the substrate, vapor phase deposition has been used widely as a technique. In vapor phase deposition, the source material may be of initially solid form which is sublimed or melted and vaporized to provide a desirable vapor phase source reagent. Alternatively, the reagent may be of normally liquid state, which is vaporized, or the reagent may be in the vapor phase in the first instance.

In the manufacture of advanced thin film materials, a variety of reagents may be used. These reagents may be used in mixture with one another in a multicomponent fluid which is utilized to deposit a corresponding multicomponent or heterogeneous film material. Such advanced thin film materials are increasingly important in the manufacture of microelectronic devices. For such applications and their implementation in high volume commercial manufacturing processes, it is essential that the film morphology, composition, and stoichiometry be closely controllable. This in turn requires highly reliable and efficient means and methods for delivery of source reagents to the locus of film formation.

Examples of advanced thin film materials include refractory materials such as high temperature superconducting (HTSC) materials including $YBa_2Cu_3O_x$, wherein x is from about 6 to 7.3, BiSrCaCuO, and TlBaCaCuO. Barium titanate, $BaTiO_3$, and barium strontium titanate, $Ba_xSr_{1-x}TiO_3$, have been identified as ferroelectric and photonic materials with unique and potentially very useful properties in thin film applications of such materials. $Ba_xSr_{1-x}Nb_2O_6$ is a photonic material whose index of refraction changes as a function of electric field and also as a function of the intensity of light upon it. Lead zirconate titanate, $PbZr_{1-x}Ti_xO_3$, is a ferroelectric material whose properties are very interesting. The Group II metal fluorides, $BaF_2$, $CaF_2$, and $SrF_2$, are useful for scintillation detecting and coating of optical fibers. Refractory oxides such as $Ta_2O_5$ are coming into expanded use in the microelectronics industry; $Ta_2O_5$ is envisioned as a thin-film capacitor material whose use may enable higher density memory devices to be fabricated.

Thin films comprising the Group II metal fluorides, $BaF_2$, $CaF_2$, and $SrF_2$, are potentially very useful as buffer layers for interfacing between silicon substrates and HTSC or GaAs overlayers or between GaAs substrates and HTSC or silicon overlayers, and combinations of two or all of such metal fluorides may be employed in forming graded compositions in interlayers providing close lattice matching at the interfaces with the substrate and overlayer constituents of the composite. For example, a silicon substrate could be coated with an epitaxial layer of $BaF_2/CaF_2$, $SrF_2/CaF_2$, or $SrF_2/CaF_2/BaF_2$, whose composition is tailored for a close lattice match to the silicon. If the ratio of the respective Group II metal species in the metal fluoride interlayers can be controlled precisely in the growth of the interlayer, the lattice constant could be graded to approach the lattice constant of GaAs. Thus, a gallium arsenide epitaxial layer could be grown over the metal fluoride interlayer, allowing the production of integrated GaAs devices on widely available, high quality silicon substrates. Another potential use of such type of metal fluoride interlayers would be as buffers between silicon substrates and polycrystalline HTSC films for applications such as non-equilibrium infrared detectors. Such an interlayer would permit the HTSC to be used in monolithic integrated circuits on silicon substrates.

$BaTiO_3$ and $Ba_xSr_{1-x}Nb_2O_6$ in film or epitaxial layer form are useful in photonic applications such as optical switching, holographic memory storage, and sensors. In these applications, the $BaTiO_3$ or $Ba_xSr_{1-x}Nb_2O_6$ film is the active element. The related ferroelectric material $PbZr_{1-x}Ti_xO_3$ is potentially useful in infrared detectors and thin film capacitors well as filters and phase shifters.

Chemical vapor deposition (CVD) is a particularly attractive method for forming thin film materials of the aforementioned types, because it is readily scaled up to production runs and because the electronic industry has a wide experience and an established equipment base in the use of CVD technology which can be applied to new CVD processes. In general, the control of key variables such as stoichiometry and film thickness, and the coating of a wide variety of substrate geometries is possible with CVD. Forming the thin films by CVD permits the integration of these materials into existing device production technologies. CVD also permits the formation of layers of the refractory materials that are epitaxially related to substrates having close crystal structures.

CVD requires that the element source reagents, i.e., the precursor compounds and complexes containing the elements or components of interest must be sufficiently volatile to permit gas phase transport into the chemical vapor deposition reactor. The elemental component source reagent must decompose in the CVD reactor to deposit only the desired element at the desired growth temperatures. Premature gas phase reactions leading to particulate formation must not occur, nor should the source reagent decompose in the lines before reaching the reactor deposition chamber. When compounds are desired to be deposited, obtaining optimal properties requires close control of stoichiometry which can be achieved if the reagent can be delivered into the reactor in a controllable fashion. In this respect the reagents must not be so chemically stable that they are non-reactive in the deposition chamber.

Desirable CVD reagents therefore are fairly reactive and volatile. Unfortunately, for many of the refractive materials described above, volatile reagents do not exist. Many potentially highly useful refractory materials have in common that one or more of their components are elements, i.e., the Group II metals barium, calcium, or strontium, or the early transition metals zirconium or hafnium, for which no or few volatile compounds well-suited for CVD are known. In many cases, the source reagents are solids whose sublimation temperature may be very close to the decomposition temperature, in which case the reagent may begin to decompose in the lines before reaching the reactor, and it therefore is very difficult to control the stoichiometry of the deposited films from such decomposition-susceptible reagents.

In other cases, the CVD reagents are liquids, but their delivery into the CVD reactor in the vapor phase has proven impractical because of problems of premature decomposition or stoichiometry control.

When the film being deposited by CVD is a multicomponent substance rather than a pure element, such as barium titanate or the oxide superconductors, controlling the stoichiometry of the film is critical to obtaining the desired film properties. In the deposition of such materials, which may form films with a wide range of stoichiometries, the controlled delivery of known proportions of the source reagents into the CVD reactor chamber is essential.

In other cases, the CVD reagents are liquids, but their delivery into the CVD reactor in the vapor phase has proven difficult because of problems of premature decomposition or stoichiometry control. Examples include the deposition of tantalum oxide from the liquid source tantalum ethoxide and the deposition of titanium nitride from bis(dialkylamide) titanium reagents.

While source reagent liquid delivery systems present distinct advantages over conventional techniques, there is often some fraction of the precursor compound that decomposes into very low volatility compounds that remain at the vaporization zone. This deficiency is an important issue in the operation of CVD processes that use thermally unstable solid source precursors which undergo significant decomposition at conditions needed for sublimation. Such decomposition can occur in all reagent delivery systems that involve a vaporization step, including flash vaporizer liquid delivery systems as well as more conventional reagent delivery systems that include bubblers and heated vessels operated without carrier gas.

Although well-behaved CVD precursors vaporized under "ideal" conditions will form no deposits or residue at the vaporization zone, deviations from this situation are common and can be divided into several categories:

1) Reactive impurities in either the precursor or in the carrier gas decompose at the vaporizer temperatures.
2) Spatial and temporal temperature variations occur in the vaporization zone, with temperatures in some regions being sufficient to bring about decomposition.
3) CVD precursors are employed which are thermally unstable at the sublimation temperature.

Although optimization of the conditions used in the vaporizer of reagent delivery systems can minimize the fraction of the precursor that decomposes (and remains) at the vaporization zone virtually all solid and liquid precursors undergo some decomposition when they are heated for conversion to the gas phase, although this fraction is negligibly small in "well-behaved" compounds. Use of precursors that tend to decompose near their vaporization temperature may be mandated by availability (i.e., where the selected precursor possesses the best properties of available choices) or by economics, where precursor cost is strongly dependent on the complexity of its synthesis.

Additionally, CVD precursors often contain impurities, and the presence of those impurities can cause undesirable thermally activated chemical reactions at the vaporization zone, also resulting in formation of involatile solids and liquids at that location. For example, a variety of CVD precursors (such as tantalum pentaethoxide) are water-sensitive and hydrolysis can occur at the heated vaporizer zone forming tantalum oxide particulates that may be incorporated into the growing tantalum oxide film with deleterious effects.

Despite the advantages of the liquid delivery approach, which include improved precision and accuracy for most liquid and solid CVD precursors and higher delivery rates, the foregoing deficiencies pose a serious impediment to widespread use of the vaporization liquid delivery technique for providing volatilized reagent to the CVD reactor.

Improved liquid delivery systems are disclosed in U.S. Pat. No. 5,204,314 issued Apr. 20, 1993 to Peter S. Kirlin et al. and U.S. Pat. No. 5,536,323 issued Jul. 16, 1996 to Peter S. Kirlin et al., which describe heated foraminous vaporization structures such as microporous disk elements. In use, liquid source reagent compositions are flowed onto the foraminous vaporization structure for flash vaporization. Vapor thereby is produced for transport to the deposition zone, e.g., a CVD reactor. The liquid delivery systems of these patents provide high efficiency generation of vapor from which films may be grown on substrates. Such liquid delivery systems are usefully employed for generation of multicomponent vapors from corresponding liquid reagent solutions containing one or more precursors as solutes, or alternatively from liquid reagent suspensions containing one or more precursors as suspended species.

In the liquid delivery system, the upstream pressure, i.e., the pressure existing upstream of the frit or other vaporization element, plays a critical role in the successful thermal transport of precursors. Low upstream pressures are desirable so that the sublimation temperature or the boiling point of the precursor is lowered. Lowering the upstream pressure too much, on the other hand, causes premature boil-off in the precursor delivery lines causing them to clog. When a porous frit element is employed as the vaporization element, as is typically the case, the upstream pressures are dictated by the pore size of the frit in use and are therefore fixed, for a frit of given porosity. It is advantageous to control the upstream pressure and the pressure gradient across the frit in order to optimize the transport of precursors by the liquid delivery system.

The art continues to seek improvements in liquid delivery systems for vapor-phase formation of advanced materials, as well as improvements in ancillary equipment such as fluid transport, vaporizer, mixing, and control means associated with the liquid delivery system, and process conditions and techniques for operating the liquid delivery system and ancillary equipment in a maximally efficient manner.

SUMMARY OF THE INVENTION

The present invention relates generally to an apparatus and method for vaporization of a liquid precursor for transport to a deposition zone, e.g., a chemical vapor deposition (CVD) reactor, in which the pressure upstream of the vaporization means is controllably maintained at a level commensurate with highly efficient operation of the liquid delivery system.

The liquid precursor vaporization and vapor delivery system of the invention comprises a vaporization chamber in which is disposed a porous vaporization element accommodating flow therethrough of a carrier fluid (when the vaporized precursor is transported in neat condition to the deposition zone) as well as the vaporized precursor itself. The porous vaporization element may be oriented in any suitable fashion in the chamber which accommodates or facilitates the distribution of the liquid precursor thereon. For example, the vaporization element may comprise a porous frit element, positioned in an elongate vaporization chamber generally transversely to the longitudinal axis of the vaporization chamber, with a source of precursor liquid arranged to discharge the precursor liquid onto a main surface of the porous element.

In one aspect, the invention relates to a liquid precursor vaporization and vapor delivery system of the above-described general type, in which the porous vaporization element is positioned in the vaporization chamber to define an upstream portion and a downstream portion of the chamber. The pressure in the upstream portion of the vaporization chamber is denoted $P_1$ and the pressure in the downstream portion of the vaporization chamber is denoted $P_2$. The present invention provides means and method for controlling the upstream pressure ($P_1$) independent of the downstream pressure ($P_2$).

In one aspect of the invention, the means for controlling the upstream pressure ($P_1$) independent of the downstream pressure ($P_2$) include a bypass flow passage with an inlet end and an outlet end, with the inlet end coupled in closed flow communication with the upstream portion of the vaporization chamber, for reducing the upstream pressure of the chamber. The outlet end of the chamber may be coupled in closed flow communication with suction or pump means such as a vacuum pump, piston pump, cryopump, venturi pump, rotary fan, blower, peristaltic pump, or the like. Flow control means may be associated with the fluid bypass flow passage, to selectively flow at least a part of fluid in the upstream portion of the vaporization chamber, from the upstream portion, thereby bypassing the vaporization element disposed in the vaporization chamber to the downstream portion of the chamber. The flow control means may be operatively constructed and arranged to maintain a given process condition in the vaporization chamber, such as vaporization element temperature, volumetric flow rate of fluid past the vaporization element, pressure drop across the vaporization element, selected (e.g., laminar or turbulent) hydrodynamic flow characteristics, etc.

In another aspect of the invention, the means for controlling the upstream pressure ($P_1$) independent of the downstream pressure ($P_2$) include the provision of gross fluid flow passages in the vaporization element itself, e.g., channels or holes in the vaporization element which are substantially larger (for example, at least an order of magnitude larger) in dimension than the porosity (pore size) of the vaporization element. Such through-openings in the vaporization element may, by way of illustration, be constituted by 0.1 mm to 3 mm diameter holes in a porous frit disc-shaped element of 1.5–6 centimeters diameter with pores in the range of from about 15 to 50 microns. Such through-openings provide an economical and effective way to reduce the upstream pressure by reducing the pressure drop across the porous vaporization element. The number and size of these channels can be selected, varied or adjusted in order to achieve a desired upstream pressure in use.

In a method aspect of the invention, a liquid precursor is flowed to a porous vaporization element heated to a temperature sufficient to effect vaporization of the liquid precursor thereon, and flow to a downstream vapor deposition zone. The vaporization element is disposed in a vaporization zone in such manner as to define upstream and downstream portions of such vaporization zone with the vaporization element interposed therebetween and presenting a flow resistance to fluid flowing from the upstream portion of the vaporization zone to the downstream portion thereof. Pressure in the upstream portion of the vaporization zone is controlled by diverting flow through at least one of (a) through-openings in the vaporization element, and (b) a bypass passage connected to the upstream portion of the vaporization zone, to discharge fluid from the upstream portion of the vaporization zone, exteriorly of such zone.

Other aspects, features and embodiments of the invention will be more fully apparent from the ensuing disclosure and appended claims.

DETAILED DESCRIPTION OF THE INVENTION, AND PREFERRED EMBODIMENTS THEREOF

Figure 1:
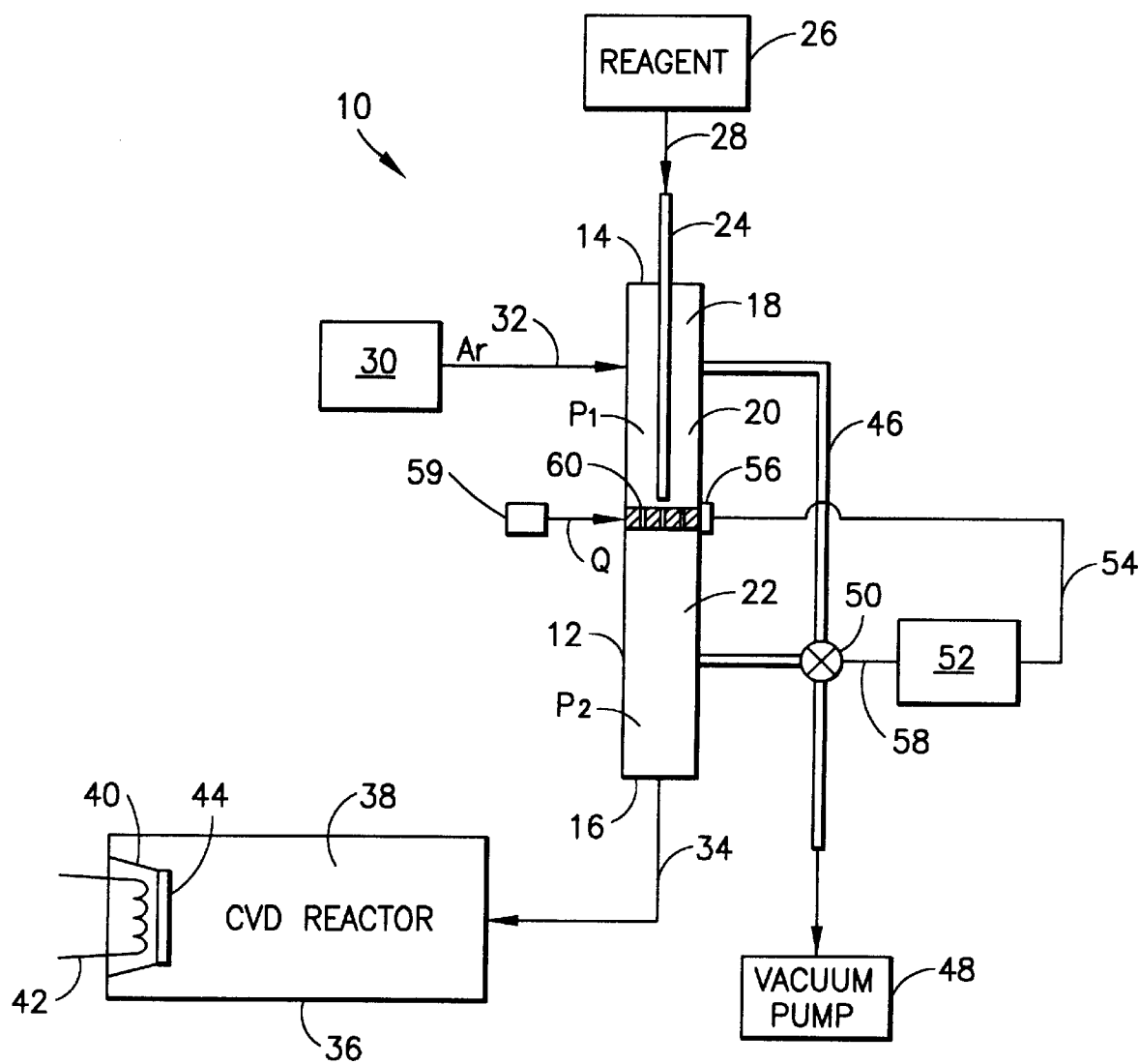
FIG. 1 is a schematic representation of a liquid precursor vaporization and vapor deposition system according to one embodiment of the present invention.

The disclosures of the following patent applications and patents are hereby incorporated herein by reference in their entirety: U.S. Pat. No. 5,711,816 issued Jan. 27, 1998; U.S. patent application Ser. No. 08/402,142 filed Mar. 10, 1995 in the name of Peter C. Van Buskirk; U.S. Pat. No. 5,741,363 issued Apr. 21, 1998; International Patent Application No. PCT/US94/02512 filed Mar. 7, 1994 and designating therein the United States as a Designated State; U.S. Pat. No. 5,536,323 issued Jul. 16, 1996; U.S. application Ser. No. 08/927,134 filed Aug. 7, 1992; U.S. Pat. No. 5,204,314; and U.S. application Ser. No. 07/549,389 filed Jul. 6, 1990.

The present invention relates to a liquid delivery and vapor deposition system, and more specifically to a liquid delivery system in which fluid pressure upstream of a porous vaporization element which acts as a fluid flow restriction or impedence element is controllable so that the pressure is modulated and maintained within allowable operating limits, and so that the upstream fluid pressure may be controlled independent of the downstream fluid pressure (downstream of the porous vaporization element).

The invention therefore may be usefully employed in instances where a liquid precursor for chemical vapor deposition is vaporized, and wherein the vaporization of the precursor is highly pressure sensitive and/or flow Tate sensitive, or where the precursor may vary considerably in vaporization characteristics during the operation of the system.

Referring now to the drawings, a liquid delivery and vapor deposition system 10 is schematically shown, as comprising a precursor vaporization chamber formed by a housing 12 having an upper inlet end 14 and a lower discharge end 16 in the orientation shown. The housing defines therewithin an interior volume 18 containing porous vaporization element 60, which may for example comprise a sintered metal or porous ceramic disc, or a grid, screen or other foraminous element. By way of specific example, the porous vaporization element may be constituted by a sintered stainless steel disc having pores in the range of 10–100 microns in diameter, and mounted with its peripheral edge in contact with the inner wall surface of the housing.

The vaporization element 60 thus is positioned in the interior volume of the housing in such manner as to divide the housing interior volume into an upstream portion 20 and a downstream portion 22.

Liquid precursor is supplied in the system by a source 26 which may comprise a vessel and associated piping, manifolding, etc., for supplying liquid precursor to line 28.

From line 28 the liquid precursor flows into feed conduit 24 and subsequently downwardly therein to the open lower end thereof. Such open lower end is positioned in close proximity to the upper surface of the vaporization element, so that in use the precursor liquid issues from conduit 28 onto the surface of the vaporization element, for vaporization by the element and flow of resulting precursor vapor in the downstream portion 22 of the housing interior volume for discharge from the housing at the discharge end 16 thereof into transport line 34.

The vaporization element is suitably heated to appropriate temperature to effect the flash vaporization of the liquid precursor by heating means 59, which supplies a heat flux Q to the vaporization element. The heating means 59 may be any heater or thermal input device, such as a fluid-based heat exchanger in thermal contact with the vaporization element, or a radiant or resistive heater, a thermal ballast body in thermal contact with the vaporization element, etc.

The transport line 34 conveys the precursor vapor into chemical vapor deposition reactor 36. The reactor includes an interior volume 38 containing a susceptor or support 40 heated by heating element 42, with a wafer 44 reposed on the support 40 to be contacted by the precursor vapor. One or more components of the precursor vapor is deposited from the vapor phase onto the surface of the wafer, e.g., to form a microelectronic device or substructure therefor.

The vaporization of the liquid precursor may be carried out "neat" without any carrier or entrainment fluid, or alternatively a carrier fluid may be flowed into the vaporization chamber to mix with and entrain the precursor vapor, so that the precursor is diluted in the vapor phase by the carrier fluid. The carrier fluid may be any suitable medium appropriate for the specific end use application of the vaporization system, e.g., an inert gas such as argon, nitrogen, helium, etc.

In the system shown illustratively in FIG. 1, the carrier fluid is supplied by source vessel 30 which is joined by line 32 to the housing, so that carrier fluid is flowed from source vessel 30 through line 32 into the interior volume of the housing of vaporization chamber 12. The thus-introduced carrier fluid then flows downwardly in the housing as shown, from the upper portion 20 through the vaporization element 60 to the lower portion 22, to entrain the vapor formed from the precursor liquid at the vaporization element.

As shown, the upstream portion 20 of the vaporization chamber 12 has joined thereto a bypass conduit 46, in fluid flow communication with the interior volume of the housing. The bypass conduit has a valve or other flow control element 50 therein, and at its exterior end, the bypass conduit is coupled with vacuum pump 48. By such arrangement, fluid from the upstream portion of the housing interior volume can be selectively removed from the housing, to maintain the upstream fluid pressure $P_1$ at a desired pressure level or value, and thereby control the pressure $P_1$ independently of downstream fluid pressure $P_2$ in the downstream portion 22 of the housing of the vaporization chamber 12.

The valve or flow control element 50 may as shown be linked to automatic control means to automatically achieve and maintain set point pressure operation of the vaporization system. As an illustrative embodiment, the valve or flow control element is shown in FIG. 1 as being linked through control signal transmission line 58 to an automatic control unit 52, which may for example comprise a microprocessor or central processing computer unit, or other control apparatus. The automatic control unit 52 may be provided with feedback, as for example by the sensor 56 linked thereto by the sensor signal transmission line 54. The sensor may be a thermocouple or other temperature sensing device, or a pressure, flow rate, concentration or other process variable sensor.

In operation, the sensor 56 senses the operative process condition and generates a sensor signal transmitted by the signal transmission line 54 to the automatic control unit 52, which then actuates the controllable valve 50 by control signal transmitted in signal transmission line 58 to the valve. The valve or flow control element may comprise any suitable element, e.g., a pneumatic, electrical, or mechanical valve, a mass flow controller unit, or other adjustable flow control means. The flow of fluid from the upstream portion of the vaporization chamber therefore is selectively adjusted in response to process conditions, which may for example include those illustratively mentioned hereinabove, as well as the downstream pressure $P_2$, to maintain the vaporization efficiency at a high or optimum level, and to achieve the desired nature and extent of vaporization of the precursor liquid.

Figure 2:
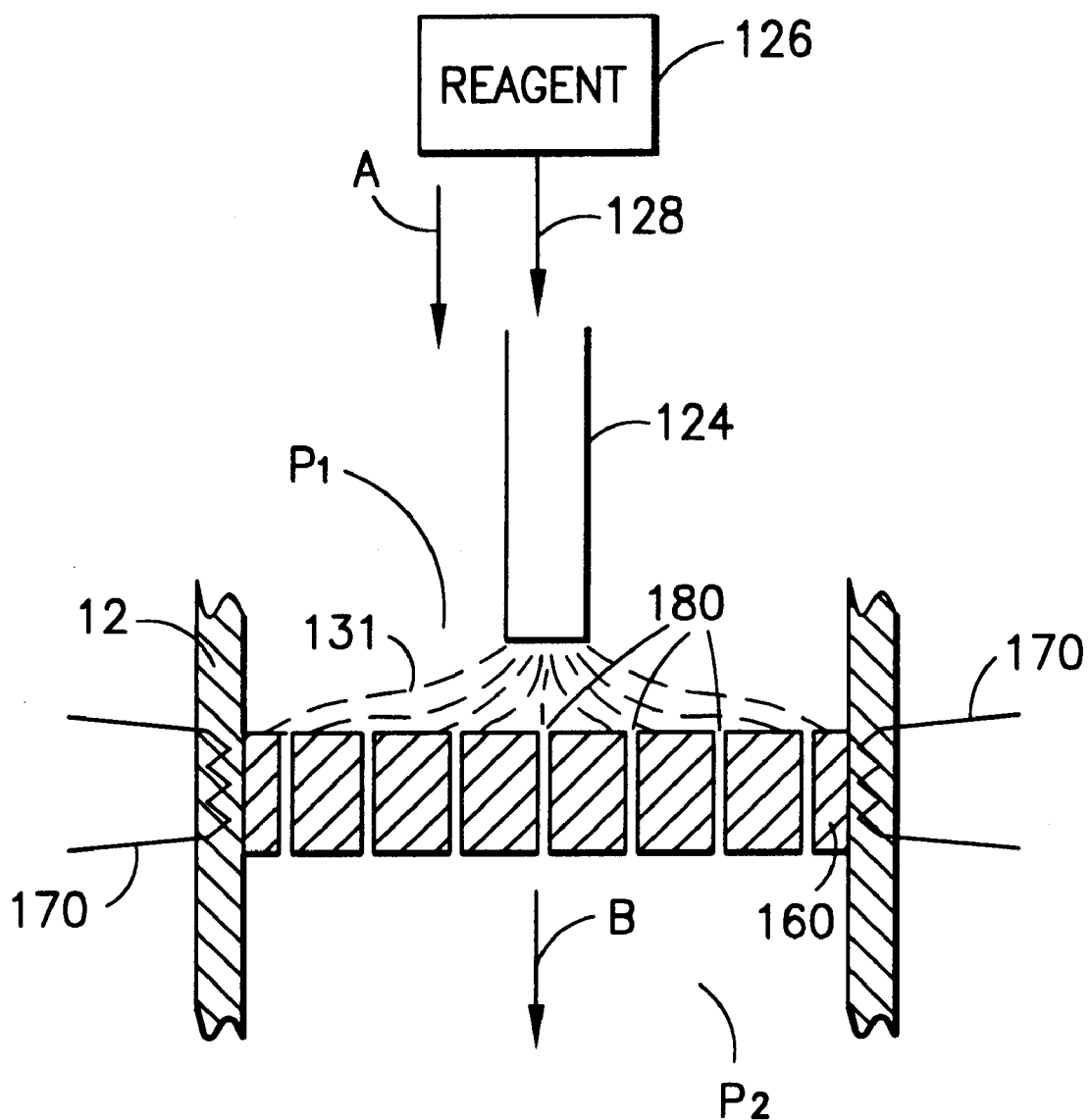
FIG. 2 is a schematic representation of a portion of a liquid precursor vaporization system according to another embodiment of the present invention.

FIG. 2 is a schematic elevation view of part of a vaporization system according to another embodiment of the invention. The reference numbers of the component parts and elements in FIG. 2 are numbered correspondingly to those in FIG. 1 hereof, by addition of "100" to the number of the corresponding part or element in FIG. 1.

As shown in FIG. 2, a porous vaporization element 160 is mounted in the chamber 12 with its peripheral edge in contact with the inner wall surface of the vaporization chamber. The vaporization element 160 may be fixedly or removably secured in position, as necessary or desirable in a given end use application of the present invention. The vaporization element 160 is of porous character as discussed earlier herein, and as more fully described in U.S. Pat. No. 5,204,314. The precursor liquid feed conduit 124 is disposed with its distal end arranged in liquid discharge relationship to the facing surface of the porous vaporization element, and receives liquid precursor 131 from source vessel 126 and feed line 128. The porous vaporization element is heated by suitable means, such as embedded resisitive heating coil 170, although the vaporization element may be suitably heated to a temperature appropriate for vaporization of the liquid precursor by any useful means, such as conductive heating means, radiant heating means, internal heat transfer passages in the vaporization element coupled with a heat transfer fluid to achieve the requisite temperature conditions at the vaporization element for vaporization of the liquid precursor, or any other means for such function.

The fluid in the upstream portion of the vaporization chamber is flowed in the downstream direction indicated by arrow A, and passes through the porous vaporizatior element 160, to the downstream portion, where the fluid continues flowing in the downstream direction indicated by the arrow B in such portion of the vaporization chamber. The pressure in the upstream portion of the vaporization chamber is shown as pressure $P_1$ and the pressure in the downstream portion is shown as pressure $P_2$.

As shown in FIG. 2, the vaporization element 160 is provided with a series of transversely spaced-apart through-openings 180, which extend vertically downward from the top surface of vaporization element to the bottom surface of such element. These through-openings 180 may be of any suitable size, shape and orientation (e.g., vertical, angular, or other orientation, circular, square or other shape cross-section, and of varying or uniform density across the surface of the vaporization element). The purpose of such through-openings is to provide bypass cross-sectional area in the vaporization element, for rapid throughput of fluid in response to temporal fluctuations in pressure, flow rate, temperature, etc. of the fluid in the upstream portion of the vaporization chamber or to maintain the upstream pressure, $P_1$, at a desired and appropriate level.

As a specific example, the vaporization element may comprise a frit with holes or channels in it with a diameter in the range of from about 0.1 mm to about 3 mm. These passages provide a ready and effective reduction of the upstream pressure by reducing the pressure drop across the frit. The number and size of these channels can be adjusted to achieve a desired upstream pressure level or value.

It will be recognized that the liquid delivery system of the present invention may be widely varied in construction and arrangement, and that the type, orientation and characteristics of the vaporization element thereof may also be widely varied within the scope and practice of the present invention. The invention is therefore intended to be broadly interpreted and construed, as encompassing all variations, modifications and other embodiments within the skill of the art based on the disclosure and teachings herein.

Industrial Applicability

The liquid delivery system of the invention is usefully employed for formation of films and material layers on substrate by deposition processes such as chemical vapor deposition. The system of the invention may variously be used to deposit high temperature superconducting materials, ferroelectric materials, photonic materials, scintillation detecting coatings, optical fiber coatings, thin film capacitor materials, buffer layer materials and interlayer materials, for structural and device applications such as the manufacture of integrated circuits, infrared detectors, optical switching system, holographic memory storage devices, sensors, filters and phase shifters.

What is claimed is:

1. A liquid delivery system for vaporization of a liquid precursor to form precursor vapor for transport to a deposition zone, said system comprising:

a vaporization chamber;

a porous vaporization element positioned in the vaporization chamber to define an upstream portion of the vaporization chamber upstream of the porous vaporization element, and a downstream portion of the vaporization chamber downstream of the porous vaporization element therein;

means for heating the vaporization element to sufficient temperature for vaporization of the liquid precursor;

means for introducing a liquid precursor to the vaporization element for heating thereof to vaporize the liquid precursor and form precursor vapor;

means for discharging precursor vapor for flow thereof to the deposition chamber; and means for diverting at least a part of the fluid in the upstream portion of the vaporization chamber past the porous vaporization element, to stabilize fluid pressure in the upstream portion of the vaporization chamber under conditions tending to perturb such fluid pressure.

2. A liquid delivery system according to claim 1, wherein the diverting means comprise:

a fluid bypass flow passage with an inlet end and an outlet end, the inlet end being coupled in closed fluid flow communication with the upstream portion of the vaporization chamber, for flowing at least a part of the fluid from the upstream portion of the chamber exteriorly thereof through the fluid bypass flow passage to the outlet end thereof, to bypass the vaporization element in the vaporization chamber; and means for controlling the flow of fluid through the fluid bypass flow passage to maintain a selected pressure level in the upstream portion of the vaporization chamber.

3. A liquid delivery system according to claim 2, wherein said controlling means comprise a sensor for sensing a process condition in the vaporization chamber, means for responsively generating a signal indicative of the process condition, and a flow controller operatively coupled with and responsive to the process condition signal generating means, to adjust the flow of fluid hugh the fluid bypass flow passage to maintain a selected pressure level in the upstream portion of the vaporization chamber.

4. A liquid delivery system according to claim 1, wherein the porous vaporization element comprises a porous disc element.

5. A liquid delivery system according to claim 4, wherein the porous disc element has a diameter of from about 1.5 to 6 centimeters.

6. A liquid delivery system according to claim 4, wherein the porous disc element has porosity in the range of from about 15 to about 50 microns diameter.

7. A liquid delivery system according to claim 1, wherein the diverting means are constructed and arranged for selectively flowing at least a part of the fluid either into the downstream portion of the vaporization chamber or into a fluid flow passage bypassing the downstream portion of the vaporization chamber.

8. A liquid delivery system according to claim 2, wherein the means for controlling the flow of fluid through the fluid bypass flow passage to maintain a selected pressure level in the upstream portion of the vaporization chamber, comprise a pump coupled to the outlet end of the fluid bypass flow passage.

9. A liquid delivery system according to claim 1, wherein the diverting means comprises through-openings in the vaporization element.

10. A liquid delivery system according to claim 9, wherein the vaporization element comprises a porous frit element.

11. A liquid delivery system according to claim 9, wherein the through-openings in the porous vaporization element are at least an order of magnitude larger in dimension than the porosity of the porous vaporization element.

12. A liquid delivery system according to claim 9, wherein the through-openings in the porous vaporization element are from about 0.1 mm to about 3 mm in diameter.

13. A liquid delivery system according to claim 9, wherein the porous vaporization element comprises a porous frit element with pores in the range of from about 15 to about 50 microns diameter.

14. A liquid delivery and vapor deposition system for vaporization of a liquid precursor to form precursor vapor and depositing at least one component of the precursor vapor on a substrate, said system comprising:

a vaporization chamber;

a porous vaporization element positioned in the vaporization chamber to define an upstream portion of the vaporization chamber upstream of the porous vaporization element, and a downstream portion of the vaporization chamber downstream of the porous vaporization element therein;

means for heating the vaporization element to sufficient temperature for vaporization of the liquid precursor;

means for introducing a liquid precursor to the vaporization element for heating thereof to vaporize the liquid precursor and form precursor vapor;

means for diverting at least a part of the fluid in the upstream portion of the vaporization chamber past the porous vaporization element, to stabilize fluid pressure in the upstream portion of the vaporization chamber under conditions tending to perturb such fluid pressure;

means for discharging precursor vapor from the vaporization chamber;

a vapor deposition reactor arranged in precursor vapor-receiving relationship to the precursor vapor discharging means, for depositing at least one component of the precursor vapor on a substrate arranged in said reactor.

15. A liquid delivery and vapor deposition system according to claim 14, wherein the diverting means are selected from the group consisting of:

(a) means for discharging fluid in the upstream portion of the vaporization chamber exteriorly of the vaporization chamber; and (b) through-openings in the porous vaporization element, having substantially greater size than porosity in the porous vaporization element.

16. A method of vaporizing a precursor liquid to form precursor vapor for vapor deposition of component(s) thereof on a substrate, said method comprising:

providing a vaporization zone containing a porous vaporization element having porosity and dividing the vaporization zone into upstream and downstream portions each having a vaporization zone pressure;

heating the porous vaporization element to sufficient temperature to vaporize precursor liquid introduced to the element;

applying the precursor liquid to the porous vaporization element for vaporization thereof to form precursor vapor;

flowing the precursor vapor to a vapor deposition zone for deposition of component(s) thereof on the substrate; and in response to process conditions tending to perturb the pressure in the upstream portion of the vaporization zone, diverting at least a portion of fluid in the upstream portion of the vaporization zone from flow through the porosity of the porous vaporization element.

17. A method according to claim 16, wherein at least a portion of fluid in the upstream portion of the vaporization zone is diverted exteriorly of the vaporization zone.

18. A method according to claim 16, wherein the porous vaporization element has through-openings therein, and at least a portion of fluid in the upstream portion of the vaporization zone is diverted through said through-openings to stabilize pressure in the upstream portion of the vaporization zone.

19. A method according to claim 16, comprising flowing the diverted fluid through a fluid bypass flow passage with an inlet end and an outlet end, with the inlet end being coupled in closed fluid flow communication with the upstream portion of the vaporization zone, and controlling the flow of fluid through the fluid bypass flow passage to maintain a selected pressure level in the upstream portion of the vaporization chamber.

20. A method according to claim 19, wherein said controlling step comprises sensing a process condition in the vaporization chamber, responsively generating a signal indicative of the process condition, and adjusting the flow of fluid through the fluid bypass flow passage in response to the process condition, to maintain a selected pressure level in the upstream portion of the vaporization chamber.

21. A method according to claim 16, wherein the porous vaporization element comprises a porous disc element.

22. A method according to claim 21, wherein the porous disc element has a diameter of from about 1.5 to 6 centimeters.

23. A method according to claim 21, wherein the porous disc element has porosity in the range of from about 15 to about 50 microns diameter.

24. A method according to claim 16, wherein at least a part of the diverted fluid is flowed either into the downstream portion of the vaporization zone or into a fluid flow passage bypassing the downstream portion of the vaporization zone.

25. A method according to claim 18, wherein the through-openings in the porous vaporization element are at least an order of magnitude larger in dimension than the porosity of the porous vaporization element.

26. A method according to claim 18, wherein the through-openings in the porous vaporization element are from about 0.1 mm to about 3 mm in diameter.

27. A method according to claim 16, wherein the porous vaporization element comprises pores in the range of from about 15 to about 50 microns diameter.

28. A liquid delivery and vapor deposition method for vaporization of a liquid precursor to form precursor vapor and depositing at least one component of the precursor vapor on a substrate, said method comprising:

providing a vaporization chamber, with a porous vaporization element positioned in the vaporization chamber to define an upstream portion of the vaporization chamber upstream of the porous vaporization element, and a downstream portion of the vaporization chamber downstream of the porous vaporization element therein;

heating the vaporization element to sufficient temperature for vaporization of the liquid precursor, introducing a liquid precursor to the vaporization element for heating thereof to vaporize the liquid precursor and form precursor vapor;

diverting at least a part of the fluid in the upstream portion of the vaporization chamber past the porous vaporization element, to stabilize fluid pressure in the upstream portion of the vaporization chamber under conditions tending to perturb such fluid pressure;

discharging precursor vapor from the vaporization chamber; and depositing at least one component of the precursor vapor on a substrate.

29. A method according to claim 28, wherein the diverting step comprises discharging fluid in the upstream portion of the vaporization chamber exteriorly of the vaporization chamber.

30. A method according to claim 28, wherein the porous vaporization element has through-openings therein of substantially greater size than porosity in the porous vaporization element, and the diverting step comprises flowing said fluid through the through-openings of the porous vaporization element.

* * * * *